(12) United States Patent
Akyildiz et al.

(10) Patent No.: US 9,397,758 B2
(45) Date of Patent: Jul. 19, 2016

(54) GRAPHENE-BASED PLASMONIC NANO-TRANSCEIVER EMPLOYING HEMT FOR TERAHERTZ BAND COMMUNICATION

(71) Applicants: Ian F. Akyildiz, Alpharetta, GA (US); Josep Miquel Jornet, Buffalo, NY (US)

(72) Inventors: Ian F. Akyildiz, Alpharetta, GA (US); Josep Miquel Jornet, Buffalo, NY (US)

(73) Assignees: Georgia Tech Research Corporation, Atlanta, GA (US); The Research Foundation for the State University of New York, Amherst, NY (US)

( * ) Notice: Subject to any disclaimer, the term of this patent is extended or adjusted under 35 U.S.C. 154(b) by 0 days.

(21) Appl. No.: 14/560,213

(22) Filed: Dec. 4, 2014

(65) Prior Publication Data

US 2015/0162993 A1   Jun. 11, 2015

Related U.S. Application Data

(60) Provisional application No. 61/912,943, filed on Dec. 6, 2013, provisional application No. 61/952,926, filed on Mar. 14, 2014.

(51) Int. Cl.
*H01L 29/66* (2006.01)
*H04B 10/90* (2013.01)
(Continued)

(52) U.S. Cl.
CPC ............ *H04B 10/90* (2013.01); *H01L 29/1606* (2013.01); *H01L 29/2003* (2013.01); *H01L 29/7787* (2013.01)

(58) Field of Classification Search
CPC .............. H01L 29/2003; H01L 29/201; H01L 29/7787; H01L 29/205
USPC .................................... 257/76, 194, E29.246
See application file for complete search history.

(56) References Cited

U.S. PATENT DOCUMENTS

| 7,947,955 B2 | 5/2011 | Kawano et al. |
| 8,507,890 B1 | 8/2013 | Koppens et al. |

(Continued)

FOREIGN PATENT DOCUMENTS

| CN | 102621767 A | 12/2013 |
| CN | 103325796 A | 12/2013 |

(Continued)

OTHER PUBLICATIONS

Llaster et al.: "Characterization of Graphene-based Nano-antennas in the Terahertz Band"; Jan. 7, 2012.

(Continued)

*Primary Examiner* — Tan N Tran
(74) *Attorney, Agent, or Firm* — Bryan W. Bockhop; Bockhop Intellectual Property Law, LLC

(57) ABSTRACT

A communication element includes a high electron mobility transistor including a gate layer. A graphene layer is disposed on the gate layer. A communication system includes a signal source, a plasmonic transmitter, a first plasmonic antenna, a second plasmonic antenna, a plasmonic receiver and a signal detector. The signal source generates a transmitted signal. The plasmonic transmitter generates a first surface plasmonic polariton wave signal corresponding to the transmitted signal. The first plasmonic antenna generates an electromagnetic signal corresponding to the surface plasmon polariton wave signal. The second plasmonic antenna generates a second surface plasmon polariton wave signal corresponding to the electromagnetic signal. The plasmonic receiver generates a received signal corresponding to the second surface plasmon polariton wave signal. The signal detector detects the received signal.

25 Claims, 4 Drawing Sheets

(51) Int. Cl.
  *H01L 29/20* (2006.01)
  *H01L 29/778* (2006.01)
  *H01L 29/16* (2006.01)

(56) References Cited

U.S. PATENT DOCUMENTS

| | | | |
|---|---|---|---|
| 8,546,848 B2 * | 10/2013 | Sato | H01L 29/41766 257/194 |
| 8,554,022 B1 * | 10/2013 | Hochberg | H01L 29/66977 257/21 |
| 8,610,617 B1 | 12/2013 | Avouris et al. | |
| 2011/0309335 A1 | 12/2011 | Mehr et al. | |
| 2012/0161098 A1 * | 6/2012 | Hiura | C23C 16/0218 257/9 |
| 2012/0261673 A1 | 10/2012 | Schulze et al. | |
| 2012/0292596 A1 | 11/2012 | Dabrowski et al. | |
| 2013/0015375 A1 | 1/2013 | Avouris et al. | |
| 2014/0091309 A1 * | 4/2014 | Hallin | H01L 29/66462 257/76 |
| 2014/0306184 A1 * | 10/2014 | Ruhl | H01L 29/1606 257/29 |

FOREIGN PATENT DOCUMENTS

| | | |
|---|---|---|
| WO | 2012119125 A2 | 9/2012 |
| WO | 2013016601 A1 | 1/2013 |
| WO | 2013083351 A1 | 6/2013 |
| WO | 2013112608 A1 | 8/2013 |
| WO | 2013184072 A1 | 12/2013 |

OTHER PUBLICATIONS

Otsuji et al.: "Emission and Detection of Terahertz Radiation Using Two-Dimensional Electrons in III-V Semiconductors and Graphene"; Jul. 1, 2012.
Abadal et al.: "Graphene-enabled Wireless Networks-on-Chip"; (Publication date unknown, assumed to be prior art).
Mohammadi et al.: "Tackling Terahertz Transceiver Design"; Terahertz Technology: Tackling Terahertz Transceiver Design; Apr. 30, 2013.
Jornet: "Terahertz Communications for Graphene-based Nano-devices"; IEEE P802.15 Working Group for Wireless Personal Area Networks (WPANs); Nov. 8, 2010.
School of Electrical and Computer Engineering, Georgia Institute of Technology: "TeraNets" Ultra-broadband Communication Networks in the Terahertz Band; Dec. 20, 2013.

* cited by examiner

GRAPHENE-BASED PLASMONIC NANO-TRANSCEIVER EMPLOYING HEMT FOR TERAHERTZ BAND COMMUNICATION

CROSS-REFERENCE TO RELATED APPLICATION(S)

This application claims the benefit of U.S. Provisional Patent Application Ser. No. 61/912,943, filed Dec. 6, 2013, and 61/952,926, filed Mar. 14, 2014, the entirety of each of which is hereby incorporated herein by reference.

BACKGROUND OF THE INVENTION

1. Field of the Invention

The present invention relates to communications devices and, more specifically, to a plasmonic communications device.

2. Description of the Related Art

Wireless data traffic has drastically increased due to a change in the way information is created, shared and consumed. This change has been accompanied by an increasing demand for much higher speed wireless communication systems. In particular, wireless data rates have doubled about every eighteen months over the last three decades and they are quickly approaching the capacity of wired communication systems. Following this trend, wireless terabit-per-second (Tbps) data links will be needed within the next five to ten years. Advanced physical layer solutions and, more importantly, new spectral bands will be required to support these extremely high data rates.

In this context, terahertz (THz) band communication is envisioned as a key wireless technology to satisfy this demand by alleviating the spectrum scarcity and capacity limitations of current wireless systems, and enabling many applications in diverse fields. The THz band is the spectral band that spans the frequencies between 0.1 THz and 10 THz.

Wireless technologies below 0.1 THz are generally not able to support Tbps links. On the one hand, advanced digital modulations, e.g., Orthogonal Frequency Division Multi-plexing (OFDM), and sophisticated communication schemes, e.g., very large scale Multiple Input Mul-tiple Output (MIMO) systems, are being used to achieve a very high spectral efficiency at frequencies below 5 GHz. However, the scarcity of the available bandwidth limits the achievable data rates. For example, in Long-Term Evolution Advanced (LTEA) networks, peak data rates in the order of 1 Gbps are possible when using a four-by-four MIMO scheme over a 100 MHz aggregated bandwidth. These data rates are three orders of magnitude below the targeted 1 Tbps. On the other hand, millimeter wave (mm-wave) communication systems, such as those at 60 GHz, can support data rates in the order of 10 Gbps within one meter. This data rate is still two orders of magnitude below the expected demand. The path to improve the data rate involves the development of more complex transceiver architectures able to implement physical layer solutions with much higher spectral efficiency. However, the usable bandwidth is usually limited to less than 7 GHz, which effectively imposes an upper bound on the data rates.

Therefore, there is a need for a communications system that can support THz band communications.

SUMMARY OF THE INVENTION

The disadvantages of the prior art are overcome by the present invention which, in one aspect, is a communication element that includes a high electron mobility transistor including a gate layer. A graphene layer is disposed on the gate layer.

In another aspect, the invention is a communication system that includes a signal source, a plasmonic transmitter, a first plasmonic antenna, a second plasmonic antenna, a plasmonic receiver and a signal detector. The signal source is configured to generate a transmitted signal. The plasmonic transmitter is responsive to the transmitted signal and is configured to generate a first surface plasmonic polariton wave signal corresponding to the transmitted signal. The first plasmonic antenna is responsive to the first surface plasmonic polariton wave signal and is configured to generate an electromagnetic signal corresponding to the surface plasmon polariton wave signal. The second plasmonic antenna is responsive to the electromagnetic signal and is configured to generate a second surface plasmon polariton wave signal corresponding to the electromagnetic signal. The plasmonic receiver is responsive to the second surface plasmon polariton wave signal and is configured to generate a received signal corresponding to the second surface plasmon polariton wave signal. The signal detector is configured to detect the received signal.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
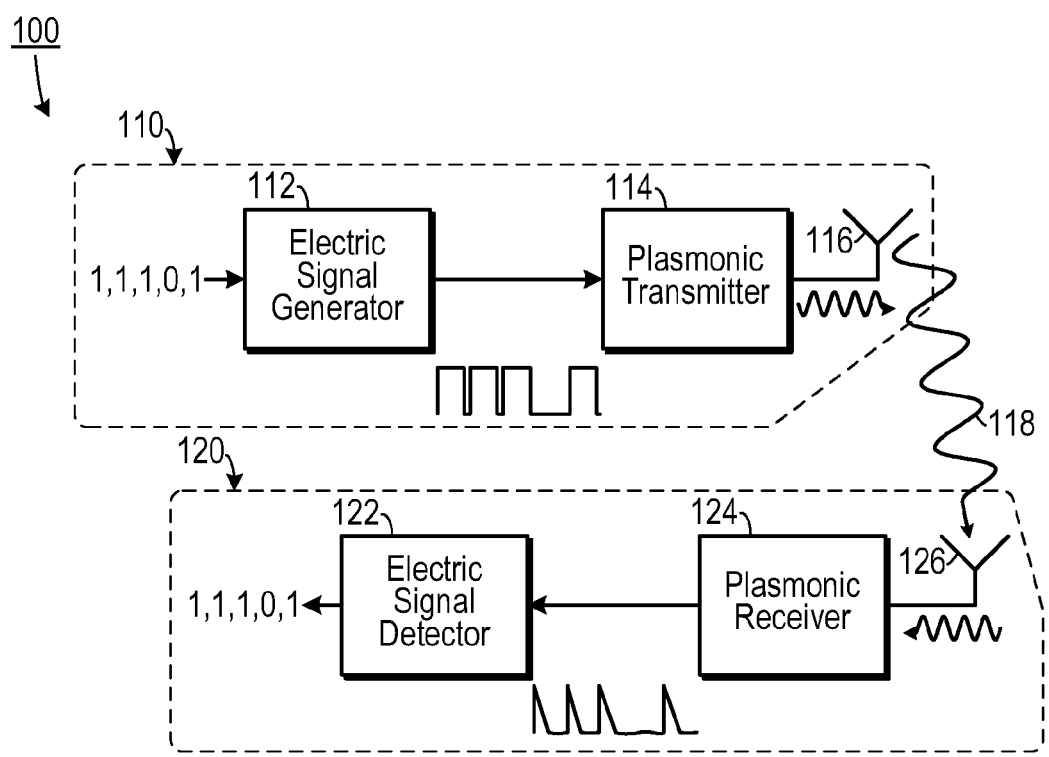
FIG. 1 is a block diagram of a communication system.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on." U.S. patent application Ser. No. 14/253,539, filed on Apr. 15, 2014, discloses plasmonic nano-antennas and is incorporated herein by reference for the purpose of disclosing the same.

As shown in FIG. 1, one embodiment of a THz band plasmonic-based communications system includes a transmitting unit 110 that transmits a THz band electromagnetic signal 118 to a receiving unit 120. The transmitting unit 110 typically includes a signal generator 112 that generates an electric signal. A plasmonic transmitter 114 generates a surface plasmonic polariton (SPP) signal, which corresponds to the electric signal, that is converted to the electromagnetic signal 118 by a first plasmonic nano-antenna 116. The electromagnetic signal 118 is received by a second plasmonic nano-antenna 126, which is part of the receiving unit 120. The second plasmonic nano-antenna 126 converts the electromagnetic signal 118 to an SPP signal that is converted into an electric signal by a plasmonic receiver 124 and the electric signal is then processed by an electric signal detector 122.

Figure 2A:
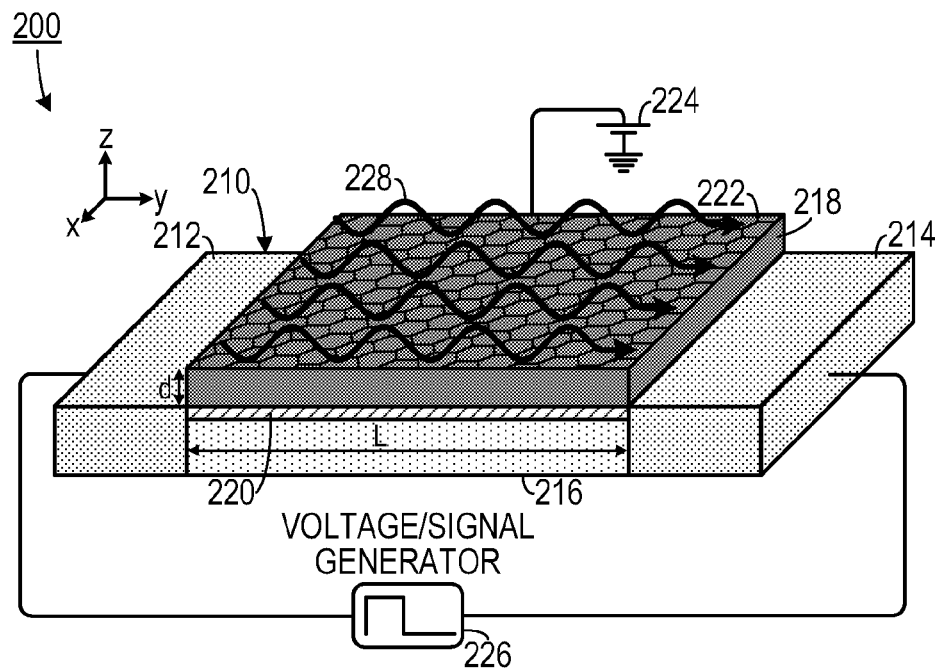
FIG. 2A is a top front view of a first embodiment of a plasmonic communication element configured as transmitter.

As shown in FIG. 2A, a plasmonic transmitter 200 can include a high electron mobility transistor (HEMT) 210 made with a III-V semiconductor with a graphene layer 222 (which could be a single layer of graphene or multiple layers of graphene) disposed on the gate layer 218 of the HEMT 210. The HEMT 210 includes a source region 212 and a drain region 214. A channel region 216 (which, in one embodiment, would typically have a length on the order of a hundred nanometers) is disposed between the source region 212 and the drain region 214. The gate layer 218 is disposed on the channel region 216. The channel region 216 includes a first material (such as an undoped direct band gap semiconductor, for example GaN, GaAs) and the gate layer 218 includes a second material (such as a doped semiconductor, for example InGaAs) that forms a heterojunction with the first material, which induces a two dimensional electron gas 220 in the channel region. The gate layer 218 can be biased with a bias voltage 224 to tune the response of the HEMT 210. When a signal generator 226 applies a voltage signal between the source region 212 and the drain region 214, the signal travels as electrons move through the electron gas layer 220, which induces a confined plasma wave that resonates in the THz band, which induces an SPP signal 228 corresponding to the voltage signal in the interface between the gate layer 218 and the graphene layer 222. The SPP signal 228 is then used to excite an SPP signal in a plasmonic antenna.

Figure 2B:
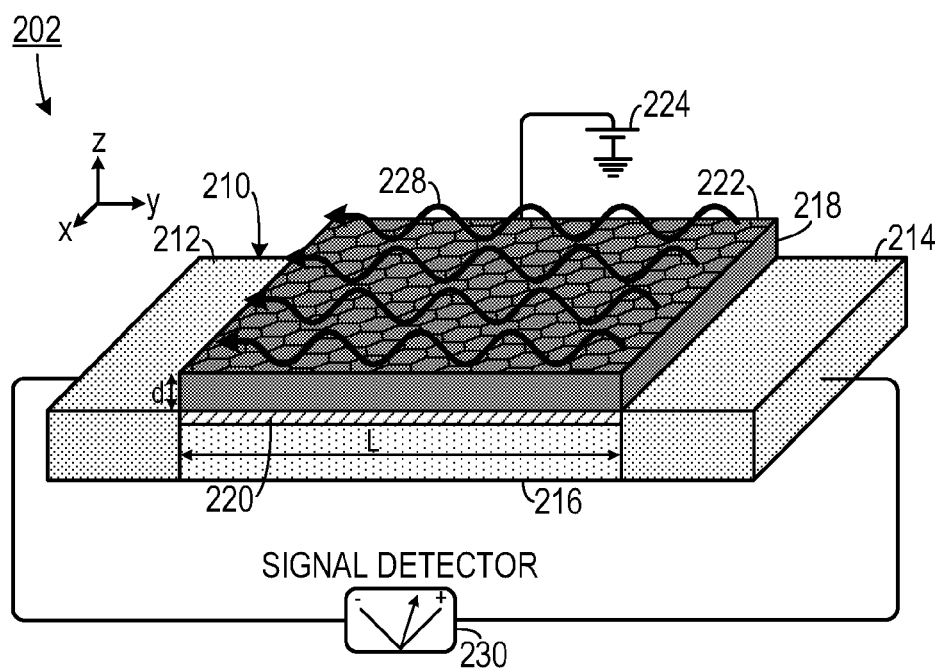
FIG. 2B is a top front view of a first embodiment of a plasmonic communication element configured as a receiver.

As shown in FIG. 2B, a similar element can be configured as a plasmonic receiver 202, in which a signal detector 230 is coupled to the source region 212 and the drain region 214. In this configuration, when an SPP signal is imparted from an antenna onto the graphene layer 222-gate layer 218 interface, a voltage signal is detectable between the source region 212 and the drain region 214 by the signal detector 230.

Figure 3A:
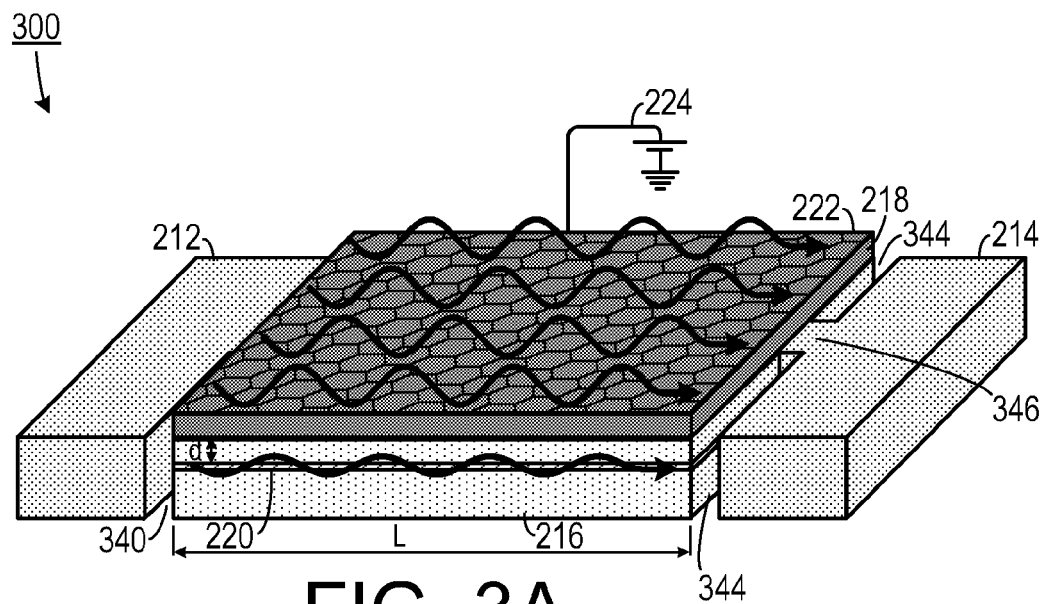
FIG. 3A is a top front view of a second embodiment of a plasmonic communication element
Figure 3B:
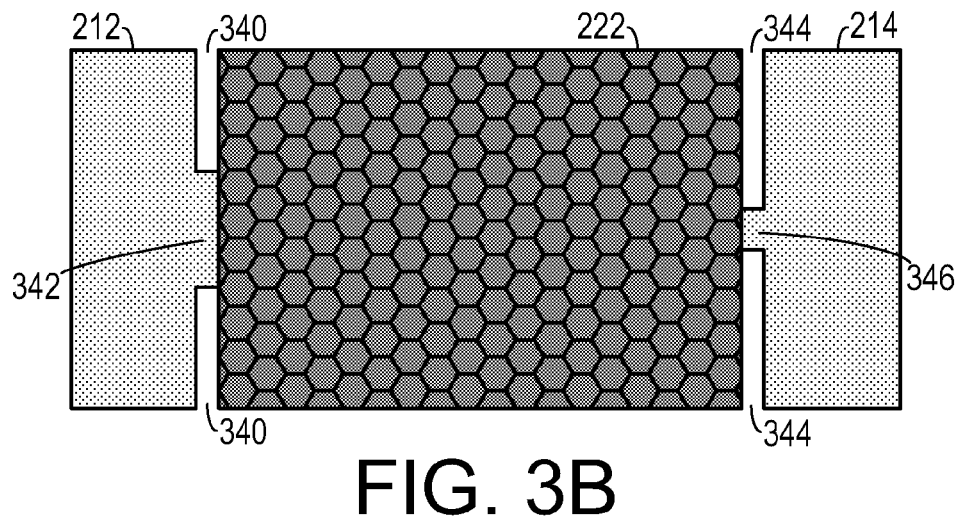
FIG. 3B is a top plan view of the embodiment shown in FIG. 4A.

As shown in FIGS. 3A and 3B, in one embodiment of a communication element 300, a first constriction 342 is formed between the source region 212 and the channel region 220 by a first pair of oppositely disposed notches 340. Similarly, as second constriction 344 is formed between the drain region 214 and the channel region 220 by a second pair of oppositely disposed notches 344. In this embodiment, the first constriction 342 is wider than the second constriction 346. Selection of the widths of the first constriction 342 and the second constriction 344 can be used to tune the device.

Figure 4A:
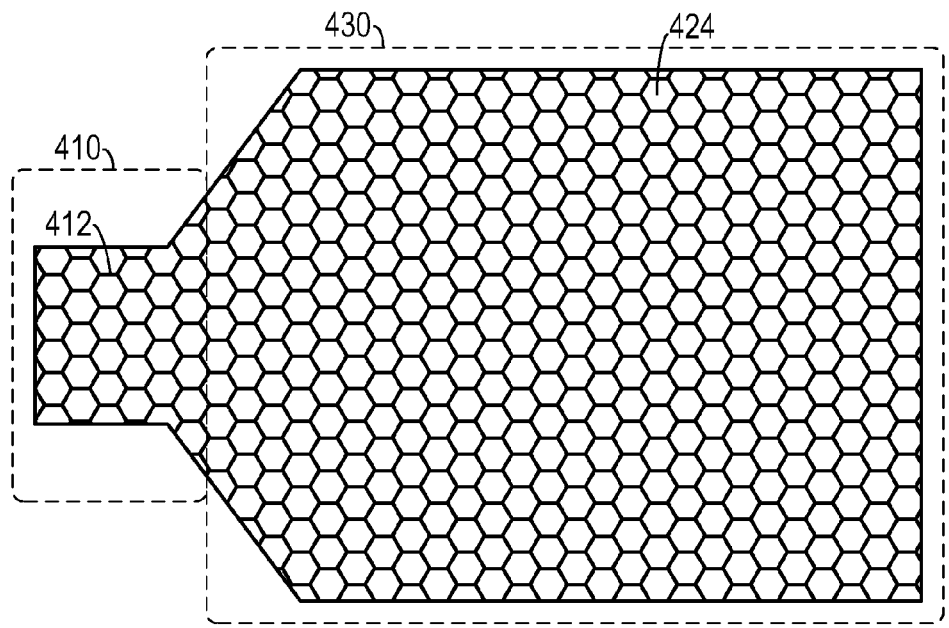
FIG. 4A is a top plan view of ab embodiment of a plasmonic communication element coupled to a plasmonic antenna.
Figure 4B:
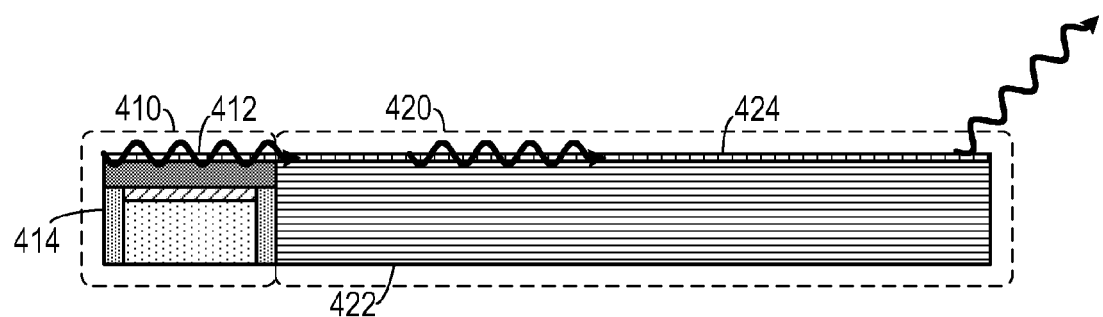
FIG. 4B is a side elevational view of the embodiment shown in FIG. 5A.

In one embodiment, as shown in FIGS. 4A and 4B, a plasmonic nano-antenna 420 can be coupled to a communications element 410 by coupling the graphene layer 412 on the HEMT 414 to a graphene layer 424 on a substrate 422. The SPP signal formed in the communications element 410 (when in the transmitter configuration) excites a corresponding SPP signal in the plasmonic nano-antenna 420, which generates a corresponding THz band electromagnetic signal. When this element is configured as a receiver, an incoming THz band electromagnetic signal induces an SPP signal in the plasmonic nano-antenna 420, which excites an SPP signal in the communications element 410, which in turn causes electrons to resonate in the 2D electron gas of the HEMT 414. This results in a corresponding voltage signal being induced across the HEMT 414.

Unlike to existing THz band sources, in this embodiment, the plasma wave is not directly radiated, but is used to induce a propagating SPP wave at the interface with the graphene layer. The oscillating image charge created at the graphene-semiconductor interface in response to the confined plasma wave oscillation in the 2DEG results in a coupled oscillating charge distribution at or near the frequency at which the system is driven. Due to the complex conductivity of graphene at THz band frequencies, this global oscillation of charge in the graphene-semiconductor interface results in an SPP wave. The propagation constant of the SPP wave, which can be tuned by modifying the chemical potential of the graphene layer, determines the SPP wave propagation length and confinement factor.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A communication element, comprising:
   (a) a high electron mobility transistor including a gate layer, including:
       (i) a source region;
       (ii) a drain region; and
       (iii) a channel region disposed between the source region and the drain region, the channel region including a first material, the gate layer being disposed on the channel region, the gate layer including a second material that forms a heterojunction with the first material, which induces a two dimensional electron gas in the channel region;
   (b) a graphene layer disposed on the gate layer; and
   (c) a plasmonic antenna coupled to the graphene layer, wherein the communication element is configured as a transmitter that is responsive to a transmitted electrical signal applied between the source region and the drain region, wherein the plasmonic antenna is configured to generate an electromagnetic signal corresponding to the transmitted electrical signal.

2. The communication element of claim 1, wherein the channel region comprises a direct band gap semiconductor and wherein the gate layer comprises a doped semiconductor.

3. The communication element of claim 2, wherein the direct band gap semiconductor comprises at least one of GaN and GaAs, and wherein the doped semiconductor comprises InGaAs.

4. The communication element of claim 1, wherein the source region, the drain region and the channel region form a substantially rectangular shape having a first end and an opposite second end, the source region comprising a first portion across the first end, the drain region comprising a second portion across the second end, the channel region comprising a third portion disposed between the first portion and the second portion, the gate layer disposed on the third portion.

5. The communication element of claim 4, wherein the first portion defines a first constriction between the source region and the channel region and wherein the second portion defines a second constriction between the channel region and the drain region.

6. The communication element of claim 5, wherein the second constriction is narrower than the first constriction.

7. The communication element of claim 5, wherein the first constriction is formed by at least one first notch defined by the first portion adjacent to the third portion and wherein the second constriction is formed by at least one second notch defined by the second portion adjacent to the third portion.

8. A communication system, comprising:
(a) a signal source configured to generate a transmitted signal;
(b) a plasmonic transmitter that is responsive to the transmitted signal and that is configured to generate a first surface plasmonic polariton wave signal corresponding to the transmitted signal;
(c) a first plasmonic antenna that is responsive to the first surface plasmonic polariton wave signal and that is configured to generate an electromagnetic signal corresponding to the surface plasmon polariton wave signal;
(d) a second plasmonic antenna that is responsive to the electromagnetic signal and that is configured to generate a second surface plasmon polariton wave signal corresponding to the electromagnetic signal;
(e) a plasmonic receiver that is responsive to the second surface plasmon polariton wave signal and that is configured to generate a received signal corresponding to the second surface plasmon polariton wave signal; and
(f) a signal detector that is configured to detect the received signal.

9. The communication system of claim 8, wherein at least one of the plasmonic transmitter and the plasmonic receiver includes a the high electron mobility transistor that comprises:
(a) a source region;
(b) a drain region;
(c) a channel region disposed between the source region and the drain region, the channel region including a first material;
(d) a gate layer disposed on the channel region, the gate layer including a second material that forms a heterojunction with the first material, which induces a two dimensional electron gas in the channel region; and
(e) a graphene layer disposed on the gate layer.

10. The communication system of claim 9, wherein the channel region comprises a direct band gap semiconductor and wherein the gate layer comprises a doped semiconductor.

11. The communication system of claim 10, wherein the direct band gap semiconductor comprises at least one of GaN and GaAs, and wherein the doped semiconductor comprises InGaAs.

12. The communication system of claim 9, configured as a transmitter that is responsive to a transmitted electrical signal applied between the source region and the drain region, wherein the plasmonic antenna is configured to generate an electromagnetic signal corresponding to the transmitted electrical signal.

13. The communication system of claim 9, configured as a receiver in which the plasmonic antenna is responsive to an electromagnetic signal and generates a surface plasmonic polariton wave signal corresponding thereto thereby causing an electrical signal corresponding to the electromagnetic signal that is detectable between the source region and the drain region.

14. The communication system of claim 9, wherein the source region, the drain region and the channel region form a substantially rectangular shape having a first end and an opposite second end, the source region comprising a first portion across the first end, the drain region comprising a second portion across the second end, the channel region comprising a third portion disposed between the first portion and the second portion, the gate layer disposed on the third portion.

15. The communication system of claim 14, wherein the first portion defines a first constriction between the source region and the channel region and wherein the second portion defines a second constriction between the channel region and the drain region.

16. The communication system of claim 15, wherein the second constriction is narrower than the first constriction.

17. The communication system of claim 15, wherein the first constriction is formed by at least one first notch defined by the first portion adjacent to the third portion and wherein the second constriction is formed by at least one second notch defined by the second portion adjacent to the third portion.

18. A communication element, comprising:
(a) a high electron mobility transistor including a gate layer, including:
(i) a source region;
(ii) a drain region; and
(iii) a channel region disposed between the source region and the drain region, the channel region including a first material, the gate layer being disposed on the channel region, the gate layer including a second material that forms a heterojunction with the first material, which induces a two dimensional electron gas in the channel region;
(b) a graphene layer disposed on the gate layer; and
(c) a plasmonic antenna coupled to the graphene layer, wherein the communication element is configured as a receiver that is responsive to an electromagnetic signal and generates a surface plasmonic polariton wave signal corresponding thereto thereby causing an electrical signal corresponding to the electromagnetic signal that is detectable between the source region and the drain region.

19. The communication element of claim 18, wherein the channel region comprises a direct band gap semiconductor and wherein the gate layer comprises a doped semiconductor.

20. The communication element of claim 19, wherein the direct band gap semiconductor comprises at least one of GaN and GaAs, and wherein the doped semiconductor comprises InGaAs.

21. The communication element of claim 18, further comprising a plasmonic antenna coupled to the graphene layer.

22. The communication element of claim 18, wherein the source region, the drain region and the channel region form a substantially rectangular shape having a first end and an opposite second end, the source region comprising a first portion across the first end, the drain region comprising a second portion across the second end, the channel region comprising a third portion disposed between the first portion and the second portion, the gate layer disposed on the third portion.

23. The communication element of claim 22, wherein the first portion defines a first constriction between the source region and the channel region and wherein the second portion defines a second constriction between the channel region and the drain region.

24. The communication element of claim 23, wherein the second constriction is narrower than the first constriction.

25. The communication element of claim 23, wherein the first constriction is formed by at least one first notch defined by the first portion adjacent to the third portion and wherein the second constriction is formed by at least one second notch defined by the second portion adjacent to the third portion.

\* \* \* \* \*